(12) United States Patent
Jung

(10) Patent No.: US 9,368,736 B2
(45) Date of Patent: Jun. 14, 2016

(54) FLEXIBLE DISPLAY APPARATUS

(71) Applicant: Samsung Display Co., Ltd., Yongin, Gyeonggi-do (KR)

(72) Inventor: Youn-Hwan Jung, Yongin (KR)

(73) Assignee: Samsung Display Co, Ltd., Yongin-si (KR)

( * ) Notice: Subject to any disclaimer, the term of this patent is extended or adjusted under 35 U.S.C. 154(b) by 0 days.

(21) Appl. No.: 14/199,998

(22) Filed: Mar. 6, 2014

(65) Prior Publication Data

US 2015/0115229 A1    Apr. 30, 2015

(30) Foreign Application Priority Data

Oct. 25, 2013   (KR) .................. 10-2013-0128029

(51) Int. Cl.
*H01L 51/00* (2006.01)
*H01L 51/52* (2006.01)
*H01L 27/32* (2006.01)

(52) U.S. Cl.
CPC .......... *H01L 51/0097* (2013.01); *H01L 51/524* (2013.01); *H01L 51/5253* (2013.01); *H01L 51/5275* (2013.01); *H01L 27/3244* (2013.01); *H01L 2251/5338* (2013.01); *Y02E 10/549* (2013.01)

(58) Field of Classification Search
CPC . G06F 3/041; H01L 51/0097; H01L 27/3244; H01L 51/5275
See application file for complete search history.

(56) References Cited

U.S. PATENT DOCUMENTS

| 8,582,047 | B2 | 11/2013 | Tho et al. | |
|---|---|---|---|---|
| 2005/0175933 | A1* | 8/2005 | Hatakeyama | 430/270.1 |
| 2008/0057090 | A1* | 3/2008 | McEntire | A61K 8/8152 424/401 |
| 2009/0321147 | A1* | 12/2009 | Yeh | G06F 3/03547 178/18.03 |
| 2010/0033087 | A1* | 2/2010 | Kim | H01L 51/5281 313/504 |
| 2010/0208170 | A1 | 8/2010 | Tanoue et al. | |
| 2011/0037036 | A1 | 2/2011 | Murouchi et al. | |
| 2012/0044618 | A1* | 2/2012 | Lee | 361/679.01 |
| 2012/0105340 | A1* | 5/2012 | Beom et al. | 345/173 |
| 2012/0319572 | A1 | 12/2012 | Lee et al. | |
| 2013/0242399 | A1* | 9/2013 | Tsuboi | G02F 1/133308 359/609 |
| 2014/0233261 | A1* | 8/2014 | Moriwaki | G02B 6/0078 362/628 |

FOREIGN PATENT DOCUMENTS

| JP | 2001-242797 A | 9/2001 | |
|---|---|---|---|
| JP | 2009-230938 A | 10/2009 | |
| KR | 10-2010-0037128 A | 4/2010 | |
| KR | 10-2011-0117746 A | 10/2011 | |
| KR | 10-2012-0138038 A | 12/2012 | |
| KR | 10-2013-0016018 A | 2/2013 | |
| WO | WO 2013046604 A1 * | 4/2013 | G09F 13/04 |

* cited by examiner

*Primary Examiner* — Mohammad Islam
*Assistant Examiner* — Ratisha Mehta
(74) *Attorney, Agent, or Firm* — Lewis Roca Rothgerber Christie LLP

(57) ABSTRACT

A flexible display apparatus includes a flexible display panel and a window cover coupled onto the flexible display panel. The flexible display panel includes a view area and a non-display area outside the view area. The view area includes an active area configured to display images, and an area outside the active area. A refractive portion is in the view area and outside the active area.

19 Claims, 4 Drawing Sheets

FLEXIBLE DISPLAY APPARATUS

CROSS-REFERENCE TO RELATED APPLICATION

This application claims priority to and the benefit of Korean Patent Application No. 10-2013-0128029, filed on Oct. 25, 2013 in the Korean Intellectual Property Office, the disclosure of which is incorporated herein in its entirety by reference.

BACKGROUND

1. Field

Aspects of one or more embodiments of the present invention are directed toward a flexible display apparatus.

2. Description of the Related Art

In general, an organic light emitting display device (OLED) (including a thin film transistor (TFT)) may be used as a display for a portable device (such as a smartphone, a digital camera, a camcorder, a portable information terminal, an ultra-slim laptop computer, or a tablet personal computer), or for an electric or electronic device (such as an ultra-slim television).

An OLED includes a first electrode, a second electrode, and an intermediate layer including an organic emission layer disposed between the first electrode and the second electrode. The OLED has a wide viewing angle, high contrast, and fast response speed.

Recently, slim display devices have been developed. From among the slim display devices, a flexible display device is considered as next display apparatus because it is easy to carry and may be applied to various types (kinds) of apparatuses. In addition, a flexible display apparatus based on an organic light emitting display technology is considered as the next display apparatus. However, a side surface of the flexible display apparatus should not be seen by a user when curved in a direction.

SUMMARY

Aspects of one or more embodiments of the present invention are directed toward a flexible display apparatus capable of preventing a side surface thereof from being seen by a user when it is bent in a direction.

Additional aspects will be set forth in part in the description which follows and, in part, will be apparent from the description, or may be learned by practice of the presented embodiments.

According to one or more embodiments of the present invention, a flexible display apparatus includes: a flexible display panel; and a window cover coupled onto the flexible display panel, wherein the flexible display panel includes a view area and a non-display area outside the view area, and the view area includes an active area configured to display images and an area outside the active area. A refractive portion is in the view area and outside the active area (e.g., the refractive portion is between an outer edge of the active area and an outer edge of the view area).

The refractive portion may extend along a periphery of the active area.

The refractive portion may be a continuous band.

The area outside the active area may include a dead space, and the refractive portion may be at the dead space.

A size of the refractive portion may correspond to a size of the dead space.

The refractive portion may extend along an outer edge of the view area, and the outer edge of the view area may be a boundary between the view area and the non-display area.

The refractive portion may include a material having a refractive index in a range from about 1.5 to about 2.1 (e.g., in a range from 1.5 to 2.1).

The refractive portion may include at least one selected from benzyl acrylate, 2-(phenylthio)ethyl acrylate, 2-(naphthalen-2-ylthio)ethyl acrylate, 2-naphthalenylthioethyl acrylate, tetra-bromobisphenol A-diglycidyletherdiacrylate, 2-phenylphenoxyethyl acrylate, 2-phenoxyethyl acrylate, and 2-(naphthalen-2-yloxy)ethyl acrylate.

The flexible display apparatus may further include an adhesive between the flexible display panel and the window cover, and the adhesive may couple the flexible display panel and the window cover to each other.

The flexible display panel may include: a flexible substrate; at least one thin film transistor (TFT) on the flexible substrate; an organic light emitting device (OLED) electrically coupled to the at least one TFT; and a thin film encapsulation layer covering the OLED.

According to one or more embodiments of the present invention, a flexible display apparatus includes: a flexible display panel; a window cover coupled to the flexible display panel; and a refractive portion on the flexible display panel and having a refractive index in a range from about 1.5 to about 2.1.

The flexible display panel may include a view area and a non-display area outside the view area, and the view area may include an active area configured to display images, and an area outside the active area, and a refractive portion may be in the view area and outside the active area.

The refractive portion may extend continuously along a periphery of the active area.

The flexible display apparatus may further include an adhesive between the refractive portion and the window cover.

The refractive portion may include at least one selected from benzyl acrylate, 2-(phenylthio)ethyl acrylate, 2-(naphthalen-2-ylthio)ethyl acrylate, 2-naphthalenylthioethyl acrylate, tetra-bromobisphenol A-diglycidyletherdiacrylate, 2-phenylphenoxyethyl acrylate, 2-phenoxyethyl acrylate, and 2-(naphthalen-2-yloxy)ethyl acrylate.

The flexible display panel and the window cover may be curved with a same radius of curvature.

The flexible display panel may include: a flexible substrate; at least one thin film transistor (TFT) on the flexible substrate; an organic light emitting device (OLED) electrically coupled to the at least one TFT; and a thin film encapsulation layer covering the OLED.

A size of the view area may correspond to a total size of the active area and the dead space.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
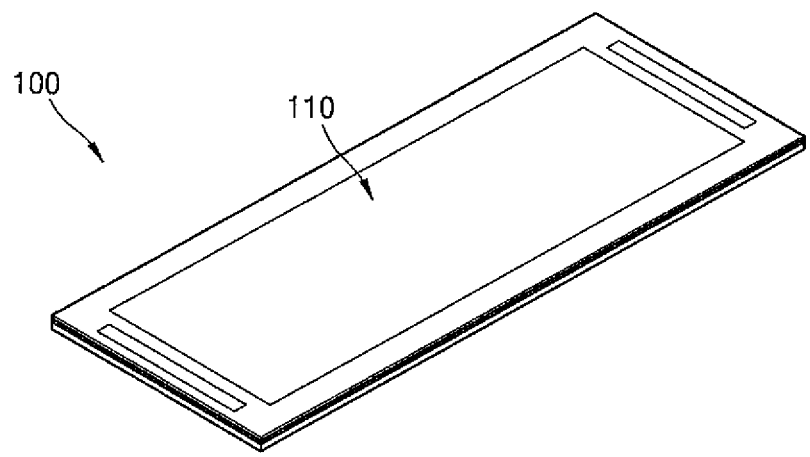
FIG. 1 is a perspective view of a flexible display apparatus that is unfolded or flat, according to an embodiment of the present invention.

As the invention allows for various changes and numerous embodiments, particular example embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art may be omitted when it is deemed that they may unnecessarily obscure the essence of the invention. Expressions such as "at least one of," when preceding a list of elements, modify the entire list of elements and do not modify the individual elements of the list.

While such terms as "first," "second," etc., may be used to describe various components, such components must not be limited to the above terms. The above terms are used only to distinguish one component from another. As used herein, the term "and/or" includes any and all combinations of one or more of the associated listed items.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "comprising," "including," or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. Spatially relative terms, such as "on", "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", "beneath", or "under" other elements or features would then be oriented "above" or "over" the other elements or features. Thus, the example term "below" may encompass both an orientation of above and below. The device may be otherwise oriented (rotated 90 degrees or at other orientations), and the spatially relative descriptors used herein interpreted accordingly. Further, the use of "may" when describing embodiment of the present invention refers to "one or more embodiments of the present invention."

Hereinafter, a flexible display apparatus and a method of manufacturing the flexible display apparatus according to embodiments of the present invention will be described below in more detail with reference to the accompanying drawings. Those components that are the same or similar are designated with the same reference numeral regardless of the figure number, and redundant explanations thereof may be omitted.

Figure 2:
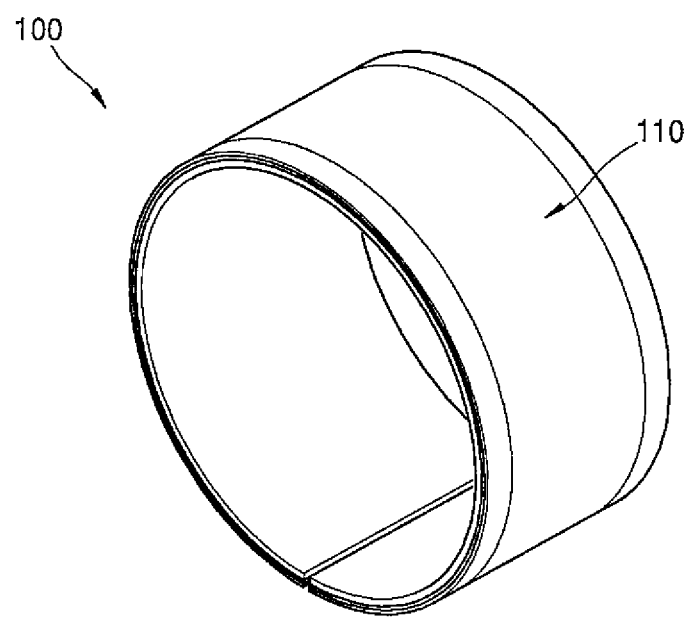
FIG. 2 is a perspective view of the flexible display apparatus shown in FIG. 1, wherein the flexible display apparatus is curved.

FIG. 1 is a perspective view showing a flexible display apparatus 100 in an unfolded state, and FIG. 2 is a perspective view showing the flexible display apparatus 100 in a curved state.

Referring to FIGS. 1 and 2, the flexible display apparatus 100 includes a flexible display panel 110 displaying images (e.g., configured to display images). The flexible display panel 110 includes various films such as a touch screen and a polarization plate, as well as a thin film for displaying images.

According to the present embodiment, the flexible display apparatus 100 is an organic light emitting display apparatus as an example; however, the embodiments of the present invention may be applied to other flexible display apparatuses such as a liquid crystal display (LCD), a field emission display apparatus, an electronic paper display apparatus, etc.

A user of the flexible display apparatus 100 may see images from various angles, for example, in an unfolded state or a curved state, according to a user's need or desire.

Figure 3:
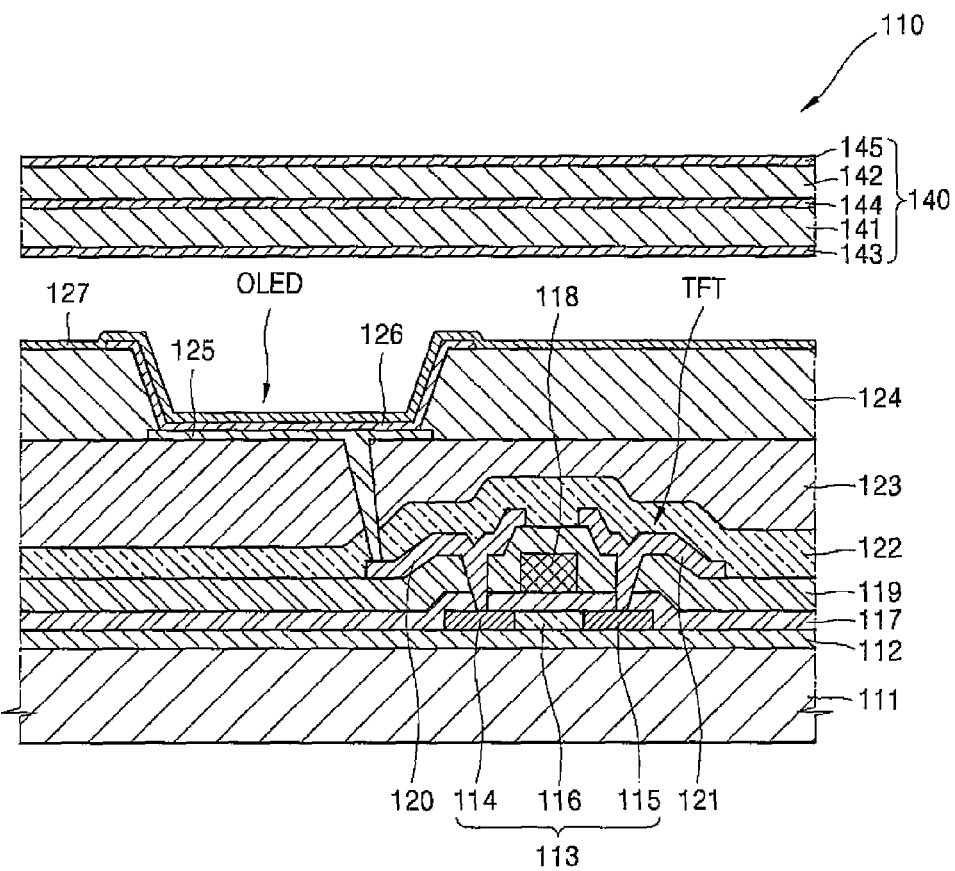
FIG. 3 is a cross-sectional view of a sub-pixel in the flexible display apparatus shown in FIG. 1.
Figure 4:
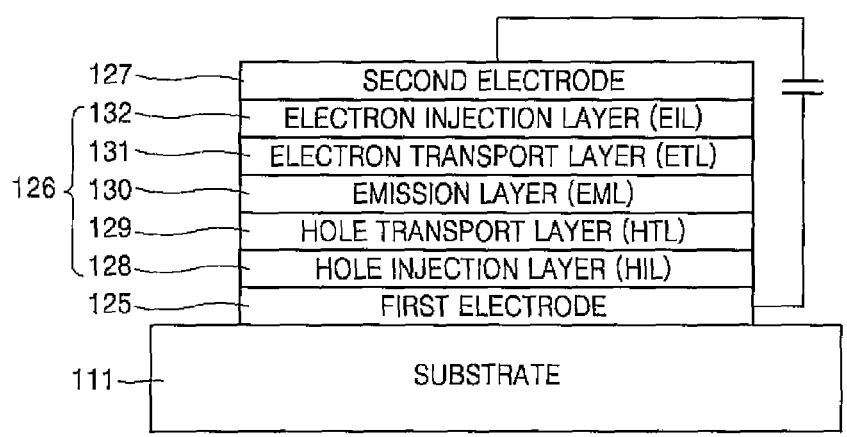
FIG. 4 is a block diagram of an organic light emitting device shown in FIG. 3.

FIG. 3 is a diagram showing a sub-pixel of the flexible display apparatus 100, and FIG. 4 is a diagram showing an organic light emitting device (OLED) shown in FIG. 3.

Here, each of the sub-pixels includes at least one thin film transistor (TFT) and an OLED. A structure of the TFT is not limited to the structure shown in FIG. 3, and the number and the structure of the TFT may be modified variously.

Referring to FIGS. 3 and 4, the flexible display panel 110 includes a flexible substrate 111. The flexible substrate 111 may be formed of an insulating material having flexibility. For example, the flexible substrate 111 may be formed of a high molecular weight material such as polyimide (PI), polycarbonate (PC), polyethersulfone (PES), polyethylene terephthalate (PET), polyethylene naphthalate (PEN), polyarylate (PAR), or fiber glass reinforced plastic (FRP).

The flexible substrate 111 may be transparent, semi-transparent, or opaque.

A barrier layer 112 is formed on the flexible substrate 111. The barrier layer 112 entirely covers an upper surface of the flexible substrate 111. The barrier layer 112 may include an inorganic layer or an organic layer.

For example, the barrier layer 112 may be formed of an inorganic material (such as silicon oxide ($SiO_x$), silicon nitride ($SiN_x$), silicon oxynitride (SiON), aluminum oxide (e.g., $Al_2O_3$), aluminum nitride (AlN), or aluminum oxynitride (AlON)), and/or an organic material (such as an acryl, polyimide, or polyester). The barrier layer 112 may be formed to have a single-layered structure or a multi-layered structure.

The barrier layer 112 blocks oxygen and moisture from penetrating therethrough, prevents moisture or impurities from being dispersed through the flexible substrate 111, and provides a flat surface on or above the flexible substrate 111.

The TFT is formed on the barrier layer 112. The TFT, according to the present embodiment, is a top gate TFT as an example; however, the TFT having another structure such as a bottom gate TFT may be formed.

A semiconductor active layer 113 is formed on the barrier layer 112. A source region 114 and a drain region 115 are formed on the semiconductor active layer 113 by doping N-type and P-type impurity ions on portions of the semiconductor active layer 113. A channel region 116 on which the impurities are not doped is formed between the source region 114 and the drain region 115.

When the semiconductor active layer 113 is formed of polysilicon, amorphous silicon is formed and crystallized to the polysilicon.

The amorphous silicon may be crystallized by using (utilizing) a rapid thermal annealing (RTA) method, a solid phase crystallization (SPC) method, an excimer laser annealing (ELA) method, a metal induced crystallization (MIC) method, a metal induced lateral crystallization (MILC) method, and/or a sequential lateral solidification (SLS) method.

When the flexible substrate 111 is utilized, according to the present embodiment, a method that does not utilize a high-temperature heating process may be used. For example, when performing a crystallization utilizing a low temperature polysilicon (LTPS) process, a laser beam is irradiated for a short period of time to activate the semiconductor active layer 113, and thus, a time of exposing the flexible substrate 111 to a relatively high temperature, for example, about 450° C. or higher, may be reduced.

In another embodiment, the semiconductor active layer 113 may be formed of oxide semiconductor.

For example, the oxide semiconductor may include an oxide of a material selected from 12, 13, and 14-Group metal atoms (such as zinc (Zn), indium (in), gallium (Ga), tin (Sn), cadmium (Cd), germanium (Ge), hafnium (Hf), or a combination thereof).

A gate insulating layer 117 is formed on the semiconductor active layer 113. The gate insulating layer 117 includes an inorganic layer (such as silicon oxide, silicon nitride, or a metal oxide, and may be formed to have a single-layered or a multi-layered structure).

A gate electrode 118 is formed at a region (e.g., at a predetermined region) of the gate insulating layer 117. The gate electrode 118 may have a single-layered or a multi-layered structure including gold (Au), silver (Ag), copper (Cu), nickel (Ni), platinum (Pt), palladium (Pd), aluminum (Al), molybdenum (Mo), chromium (Cr), or an alloy such as aluminum: neodymium (Al:Nd) and molybdenum:tungstun (Mo:W).

An interlayer insulating layer 119 is formed on the gate electrode 118. The interlayer insulating layer 119 may be formed of an insulating inorganic material (such as silicon oxide or silicon nitride) or an insulating organic layer.

A source electrode 120 and a drain electrode 121 are formed on the interlayer insulating layer 119. For example, one or more contact openings (e.g., one or more contact holes) are formed by selectively removing the gate insulating layer 117 (e.g., removing one or more portions of the gate insulating layer 117) and the interlayer insulating layer 119 (e.g., removing one or more portions of the interlayer insulating layer 119), the source electrode 120 is electrically coupled to (e.g., electrically connected to) the source region 114 via one of the contact openings, and the drain electrode 121 is electrically coupled to (e.g., electrically connected to) the drain region 115 via another of the contact openings.

A passivation layer 122 is formed on the source electrode 120 and the drain electrode 121. The passivation layer 122 may be formed of an inorganic material (such as silicon oxide or silicon nitride) or an organic material.

A planarization layer 123 is formed on the passivation layer 122. The planarization layer 123 may include an organic layer formed of an acryl, polyimide, and/or benzocyclobutene (BCB).

An organic light emitting device (OLED) is formed on the TFT.

To form the OLED, a first electrode 125 corresponding to a pixel electrode is electrically coupled to (e.g., electrically connected to) one of the source electrode 120 and the drain electrode 121 via a contact opening (that is, via a contact opening or hole through the planarization layer 123 and the passivation layer 122).

The first electrode 125 functions as an anode from among the electrodes included in the OLED, and may be formed of various conductive materials. The first electrode 125 may be formed as a transparent electrode or a reflective electrode according to a usage thereof.

For example, when the first electrode 125 is formed as a transparent electrode, the first electrode 125 may be formed of indium tin oxide (ITO), indium zinc oxide (IZO), zinc oxide (ZnO), or indium oxide ($In_2O_3$). When the first electrode 125 is formed as a reflective electrode, the first electrode 125 may be constructed by forming a reflective layer using silver (Ag), magnesium (Mg), aluminum (Al), platinum (Pt), palladium (Pd), gold (Au), nickel (Ni), neodymium (Nd), iridium (Ir), chromium (Cr), or a compound thereof, and depositing ITO, IZO, ZnO, or $In_2O_3$ on the reflective layer.

A pixel defining layer (PDL) 124 is formed on the planarization layer 123 so as to cover edges of the first electrode 125 of the OLED. The PDL 124 defines an emission region in each of the sub-pixels by surrounding edges of the first electrode 125.

The PDL 124 may be formed of an organic material or an inorganic material.

For example, the PDL 124 may be formed of an organic material (such as polyimide, polyamide, benzocyclobutene, an acryl resin, or a phenol resin) or an inorganic material (such as silicon nitride ($SiN_x$)). The PDL 124 may be formed to have a single-layered structure or a multi-layered structure.

An intermediate layer 126 is formed on a portion of the first electrode 125, which is exposed by etching a part of the PDL 124. The intermediate layer 126 may be formed by a deposition process.

In the present embodiment, the intermediate layer 126 is patterned to correspond to each of the sub-pixels, that is, the patterned first electrode 125; however, the embodiments of the present invention are not limited thereto, that is, the sub-pixel may have various structures.

The intermediate layer 126 may be formed of a low molecular weight organic material or a high molecular weight organic material.

As shown in FIG. 4, the intermediate layer includes an emission layer (EML) 130, and additionally, may include at least one of a hole injection layer (HIL) 128, a hole transport layer (HTL) 129, an electron transport layer (ETL) 131, and an electron injection layer (EIL) 132. In the present embodiment, the intermediate layer 126 may include the emission layer (EML) and other various functional layers.

Referring back to FIG. 3, a second electrode 127 corresponding to a common electrode of the OLED is formed on the intermediate layer 126. The second electrode 127 may be formed as a transparent electrode or a reflective electrode, similar to the first electrode 125.

The first electrode 125 and the second electrode 127 are insulated from each other by the intermediate layer 126. When voltages are applied to the first electrode 125 and the second electrode 127, the intermediate layer 126 emits visible rays (i.e., light) to realize or display images that may be recognized by a user.

The second electrode 127 may be formed of a transparent electrode or a reflective electrode, similar to the first electrode 125.

When the second electrode 127 is formed as a transparent electrode, metal having a small work function, that is, lithium (Li), calcium (Ca), lithium fluoride/calcium (LiF/Ca), lithium fluoride/aluminum (LiF/Al), aluminum (Al), magnesium (Mg), and/or a combination thereof, is deposited on the intermediate layer 126, and then, a material for forming the transparent electrode (such as ITO, IZO, ZnO, or $In_2O_3$) may be formed thereon.

When the second electrode 127 is formed as a reflective electrode, Li, Ca, LiF/Ca, LiF/Al, Al, Mg, or a combination (e.g., compound) thereof may be entirely deposited to form the second electrode 127.

When the first electrode 125 is formed as the transparent electrode or the reflective electrode, the first electrode 125 may be formed to have a shape corresponding to a shape of the opening in each of the sub-pixels. The second electrode 127 may be formed by entirely forming the transparent electrode or the reflective electrode on an entire display area. However, the second electrode 127 may be formed in various suitable patterns, and not be entirely formed on the display area. The first electrode 125 and the second electrode 127 may be formed at opposite locations.

A thin film encapsulation layer 140 is formed on the OLED. The thin film encapsulation layer 140 is formed to protect the intermediate layer 126 and other thin films against external moisture or oxygen.

The thin film encapsulation layer 140 may include at least one organic layer and at least one inorganic layer. For example, the thin film encapsulation layer 140 may include organic layers 141 and 142 formed of an epoxy, polyimide, polyethylene terephthalate, polycarbonate, polyethylene, or a polyacrylate, and inorganic layers 143, 144, and 145 formed of silicon oxide (e.g., $SiO_2$), silicon nitride ($SiN_x$), aluminum oxide (e.g., $Al_2O_3$), titanium oxide (e.g., $TiO_2$), zirconium oxide ($ZrO_x$), or zinc oxide (e.g., ZnO). The thin film encapsulation layer may include a plurality of inorganic layers, or an inorganic layer and an organic layer. A top layer 145 of the thin film encapsulation layer 140 that is exposed to the outside may be formed of an inorganic layer in order to prevent intrusion of moisture into the OLED.

Here, the flexible display apparatus 100 includes a refractive portion formed of a high refractive index in order to prevent side surfaces thereof from being seen by or visible to a user due to the refraction.

This will be described in more detail below.

Figure 5:
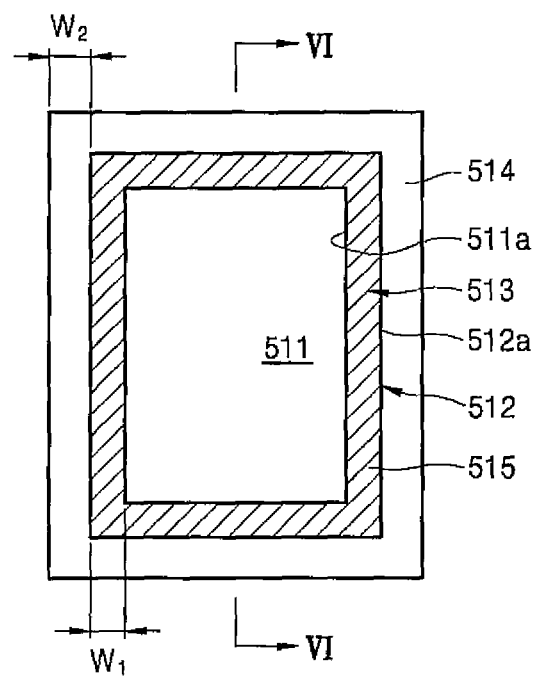
FIG. 5 is a plan view of the flexible display apparatus shown in FIG. 1 in an unfolded or flat state.
Figure 6:
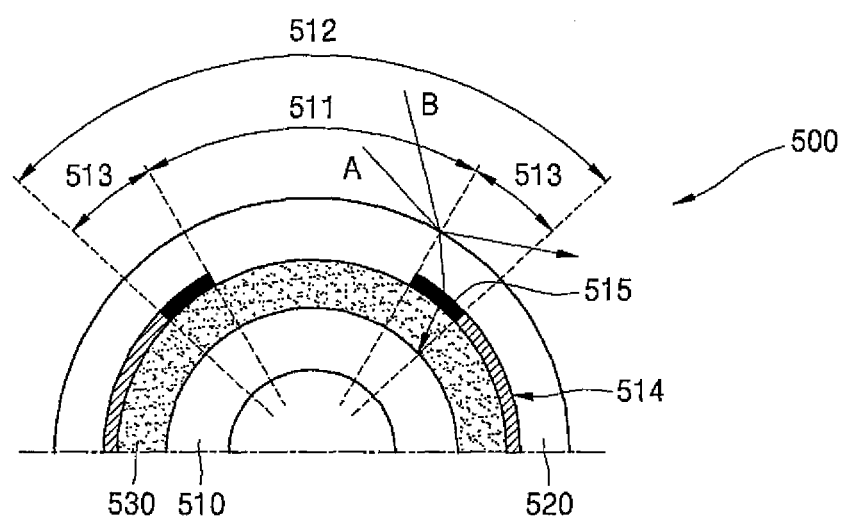
FIG. 6 is a cross-sectional view of the flexible display apparatus taken along a line VI-VI of FIG. 5, wherein the flexible display apparatus is curved.

FIG. 5 is a plan view of a flexible display apparatus 500 according to an embodiment of the present invention, and FIG. 6 is a cross-sectional view of the flexible display apparatus 500 of FIG. 5 taken along the line VI-VI when the flexible display apparatus 500 is in a curved state.

Referring to FIGS. 5 and 6, the flexible display apparatus 500 includes a flexible display panel 510 and a window cover 520 provided on the flexible display panel 510.

The flexible display panel 510 includes a flexible substrate, at least one TFT formed on the flexible substrate, an OLED electrically coupled to (e.g., electrically connected to) the TFT, and a thin film encapsulation layer covering the TFT and the OLED, as described above. In addition, the flexible display panel 510 may include various functional layers such as a touch screen and a polarization plate.

The window cover 520 is provided to protect the flexible display panel 510. The window cover 520 is formed of a flexible material so as to be curved with the flexible display panel 510. The window cover 520 may be curved with the same radius of curvature as that of the flexible display panel 510. The window cover 520 may be formed of a transparent material so that a user may see images displayed on the flexible display panel 510.

The window cover 520 is coupled to (e.g., attached onto) the flexible display panel 510 via an adhesive 530. The window cover 520 is located above the flexible display panel 510 (e.g., the window cover 520 is located above the flexible display panel 510 in a vertical direction).

The flexible display panel 510 includes an active area (A/A) 511 (that is, a display area for displaying images), a view area (V/A) 512, and a non-display area 514. The V/A 512 includes the NA 511 and a dead space 513 extending from edges (e.g., outer edges) of the A/A 511 and having a width $W_1$ (e.g., having a predetermined width $W_1$). A size of the V/A 512 corresponds to a total size of the A/A 511 and the dead space 513. The dead space 513 extends along the entire boundary of the A/A 511 (e.g., the entire periphery of the A/A 511) with the width $W_1$ (e.g., the predetermined width $W_1$). The dead space 513 includes a region where wires electrically coupled to (e.g., electrically connected to) devices patterned in the active area 511 are arranged.

The non-display area 514 is formed from the outside of the V/A 512 to edges of the flexible display panel 510. The non-display area 514 may be a region realizing various colors, printed characters, or figures. The non-display area 514 may shield or block light.

In a state where the flexible display apparatus 500 is unfolded, portions (e.g., unnecessary portions or non-display portions) at edges thereof may be seen or be visible from the front side of the flexible display panel 510.

Also, in a state where the flexible display apparatus 500 is curved, the display area of a screen may be covered by the non-display area 514 when the flexible display apparatus 500 is seen from a side portion thereof because a width $W_2$ of the non-display area 514 is relatively wide.

Accordingly, when the width $W_2$ of the non-display area 514 is narrow, some of the light is reflected (A); however, some of the light is incident to the flexible display panel 510 via the dead space 513, thereby generating a viewing angle of 90° or greater. Accordingly, wires may be seen, and thus, an outer appearance of the flexible display panel 510 may be degraded.

In the present embodiment, a refractive portion 515 is formed between an outer edge 511a of the A/A 511 and an outer edge 512a of the V/A 512 in order to reduce the above refraction phenomenon. The outer edge 512a of the V/A 512 forms a boundary (or interface) with the non-display area 514 (e.g., is a boundary between the V/A 512 and the non-display area 514).

The refractive portion 515 is formed along the boundary (e.g., along the sides) of the A/A 511. The refractive portion 515 is formed as a continuous band along the boundary (e.g., the periphery) of the A/A 511. The refractive portion 515 is substantially formed at the dead space 513, and thus, may have a size corresponding to that of the dead space 513.

The refractive portion 515 is formed between the window cover 520 and the adhesive 530. However, the refractive portion 515 may be formed between the flexible display panel 510 and the adhesive 530.

The refractive portion 515 may be formed of a material having a high refractive index in order to reduce the above phenomenon due to the refraction of light. That is, the refractive portion 515 having the high refractive index is partially formed between the outer edge 511a of the A/A 511 and the outer edge 512a of the V/A 512, and thus, the viewing angle (B) may be reduced.

The refractive portion 515 may include a high-refractive ink, for example, at least one of selected from benzyl acrylate, 2-(phenylthio)ethyl acrylate, 2-(naphthalen-2-ylthio)ethyl acrylate, 2-naphthalenylthioethyl acrylate, tetra-bromo-bisphenol A-diglycidyletherdiacrylate, 2-phenylphenoxy-ethyl acrylate, 2-phenoxyethyl acrylate, and 2-(naphthalen-2-yloxy)ethyl acrylate that may be used as an elastomer.

Here, the refractive index of the refractive portion 515 ranges from about 1.5 to about 2.1.

For example, at least one selected from benzyl acrylate having a refractive index of 1.5161, 2-(phenylthio)ethyl acrylate having a refractive index of 1.557, 2-(naphthalen-2-ylthio)ethyl acrylate having a refractive index of 1.620, 2-naphthalenylthioethyl acrylate having a refractive index of 1.620, tetra-bromobisphenol A-diglycidyletherdiacrylate having a refractive index of 1.5902, 2-phenylphenoxyethyl acrylate having a refractive index of 1.579, 2-phenoxyethyl acrylate having a refractive index of 1.518, and 2-(naphthalen-2-yloxy)ethyl acrylate having a refractive index of 1.589 at a temperature of 20° C. may be used.

When the refractive index of the refractive portion 515 is about 1.5 or less, the refractive index becomes similar to that of other materials forming the flexible display apparatus 500, for example, the window cover 520, and the refraction effect is not obtained. In addition, if the refractive index of the refractive portion 515 is about 2.1 or greater, unnecessary refraction occurs, and thus, images displayed at the NA 511 may not be seen or visible to a user.

A designed (enhanced) viewing distance obtained through experiments performed by the present applicant is as follows.

Here, the viewing distances were measured in a state where the flexible display apparatus 500 was flat and curved.

Figure 7:
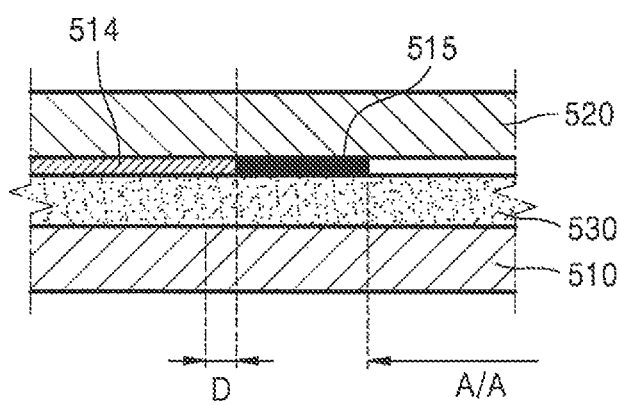
FIG. 7 is a cross-sectional view showing an enlarged portion of a refractive portion in the flexible display apparatus shown in FIG. 1.

According to the present embodiment, 0.26 mm is a limit of the viewing distance in a state where the flexible display apparatus 500 is flat. As shown in FIG. 7, the viewing distance D is a maximum distance at which an inside of the flexible display apparatus 500 (that is, an inside of the non-display area 514) is seen or visible from the side surfaces of the flexible display apparatus 500. That is, a viewing distance less than D prevent the inside of the flexible display apparatus 500 from being seen or visible.

The viewing distance D is calculated by using the refractive index according to following Equation 1.

$$\text{viewing distance}(D) = \text{thickness}(t) \times \text{Tan}\left(\sin - 1\left(\frac{\sin(\text{viewing angle})}{\text{average refractive index}}\right)\right) \quad \text{Equation 1}$$

Here, the average refractive index is a refractive index of the refractive portion 515, and the thickness (t) is a thickness of the refractive portion 515.

In a state where the flexible display apparatus 500 is flat, when the viewing angle is 45°, the viewing distance was measured about 0.24 mm.

Next, the viewing distance was measured in a state where the flexible display apparatus 500 is curved in a direction. As flexible display apparatus 500 is curved, the viewing angle increases.

When the viewing angle was 71° and the average refractive index was 1.5, the viewing distance in the curved state was about 0.37 mm. Also, when the viewing angle was 71° and the average refractive index was 2.1, the viewing distance in the curved state was about 0.24 mm.

However, in a comparative or related display apparatus that does not include the refractive portion 515, when the viewing angle is 71° and the average refractive index of the window cover is 1.45, the viewing distance of the curved state is about 0.39 mm.

As described above, when the flexible display apparatus 500 includes the refractive portion 515 having the high refractive index of about 1.5 to about 2.1 (e.g., of 1.5 to 2.1), the viewing distance ranges from about 0.24 mm to about 0.37 mm. Thus, the viewing distance of the flexible display apparatus 500 may be less than that of the comparative or related display apparatus that does not use the refractive portion 515.

As described above, according to aspects of embodiments of the present invention, the side portions of the flexible display apparatus may not be seen or visible when the flexible display apparatus is curved because the refractive portion is formed between the active area and the non-display area (e.g., the refractive portion is formed at the view area outside of the active area).

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A flexible display apparatus comprising:
   a flexible display panel; and
   a window cover coupled onto the flexible display panel,
   wherein the flexible display panel comprises a view area and a non-display area outside the view area,
   wherein the view area comprises an active area configured to display images, and an area outside the active area,
   wherein a refractive portion is between an outer edge of the active area and an outer edge of the view area,
   wherein the refractive portion extends along the outer edge of the view area, and
   wherein the outer edge of the view area is a boundary between the view area and the non-display area.

2. The flexible display apparatus of claim 1, wherein the refractive portion comprises a material having a refractive index in a range from about 1.5 to about 2.1.

3. The flexible display apparatus of claim 2, wherein the refractive portion comprises at least one selected from benzyl acrylate, 2-(phenylthio)ethyl acrylate, 2-(naphthalen-2-ylthio)ethyl acrylate, 2-naphthalenylthioethyl acrylate, tetra-bromobisphenol A-diglycidyletherdiacrylate, 2-phenylphenoxyethyl acrylate, 2-phenoxyethyl acrylate, and 2-(naphthalen-2-yloxy)ethyl acrylate.

4. The flexible display apparatus of claim 1, further comprising:
   an adhesive between the flexible display panel and the window cover,
   wherein the adhesive couples the flexible display panel and the window cover to each other.

5. The flexible display apparatus of claim 1, wherein the flexible display panel comprises:
   a flexible substrate;
   at least one thin film transistor (TFT) on the flexible substrate;
   an organic light emitting device (OLED) electrically coupled to the at least one TFT; and
   a thin film encapsulation layer covering the OLED.

6. The flexible display apparatus of claim 1, wherein the refractive portion has a substantially constant thickness.

7. The flexible display apparatus of claim 1, wherein the refractive portion is outside the active area.

8. The flexible display apparatus of claim 7, wherein the refractive portion is a continuous band.

9. The flexible display apparatus of claim 7, wherein the area outside the active area comprises a dead space, and the refractive portion is at the dead space.

10. The flexible display apparatus of claim 9, wherein a size of the refractive portion corresponds to that of the dead space.

11. The flexible display apparatus of claim 9, wherein a size of the view area corresponds to a total size of the active area and the dead space.

12. A flexible display apparatus comprising:
a flexible display panel comprising a view area and a non-display area outside the view area;
a window cover coupled to the flexible display panel; and
a refractive portion on the flexible display panel and having a refractive index in a range from about 1.5 to about 2.1,
wherein the view area has an active area configured to display images, and an area outside the active area, and
wherein the refractive portion is between an outer edge of the active area and an outer edge of the view area.

13. The flexible display apparatus of claim 12, wherein the refractive portion is in the view area and outside the active area.

14. The flexible display apparatus of claim 13, wherein the refractive portion extends continuously along a periphery of the active area.

15. The flexible display apparatus of claim 12, further comprising:
an adhesive between the refractive portion and the window cover.

16. The flexible display apparatus of claim 12, wherein the refractive portion comprises at least one selected from benzyl acrylate, 2-(phenylthio)ethyl acrylate, 2-(naphthalen-2-ylthio)ethyl acrylate, 2-naphthalenylthioethyl acrylate, tetrabromobisphenol A-diglycidyletherdiacrylate, 2-phenylphenoxyethyl acrylate, 2-phenoxyethyl acrylate, and 2-(naphthalen-2-yloxy)ethyl acrylate.

17. The flexible display apparatus of claim 12, wherein the flexible display panel and the window cover are curved with a same radius of curvature.

18. The flexible display apparatus of claim 12, wherein the flexible display panel comprises:
a flexible substrate;
at least one thin film transistor (TFT) on the flexible substrate;
an organic light emitting device (OLED) electrically coupled to the at least one TFT; and
a thin film encapsulation layer covering the OLED.

19. The flexible display apparatus of claim 12, wherein the refractive portion has a substantially constant thickness.

* * * * *